United States Patent
McElroy et al.

(10) Patent No.: US 8,767,496 B2
(45) Date of Patent: *Jul. 1, 2014

(54) BIAS SENSING IN DRAM SENSE AMPLIFIERS THROUGH VOLTAGE-COUPLING/DECOUPLING DEVICE

(75) Inventors: David J. McElroy, Owens Crossroads, AL (US); Stephen L. Casper, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 361 days.

This patent is subject to a terminal disclaimer.

(21) Appl. No.: 13/039,169

(22) Filed: Mar. 2, 2011

(65) Prior Publication Data

US 2011/0157962 A1    Jun. 30, 2011

Related U.S. Application Data

(60) Division of application No. 12/498,541, filed on Jul. 7, 2009, now Pat. No. 7,903,488, which is a continuation of application No. 11/452,783, filed on Jun. 13, 2006, now Pat. No. 7,567,477, which is a division of application No. 10/874,995, filed on Jun. 23, 2004, now Pat. No. 7,072,235, which is a continuation of application No. 10/233,871, filed on Aug. 29, 2002, now Pat. No. 6,757,202.

(51) Int. Cl.
*G11C 7/00*    (2006.01)

(52) U.S. Cl.
USPC .......... 365/222; 365/190; 365/205; 365/208; 365/207; 365/189.09; 365/227; 365/228; 365/204; 365/210.11; 365/210.12

(58) Field of Classification Search
USPC ............. 365/205, 210, 208, 207, 206, 190, 365/189.09, 227, 228, 226, 222, 204, 365/210.11, 210.12

See application file for complete search history.

(56) References Cited

U.S. PATENT DOCUMENTS

| | | |
|---|---|---|
| 4,625,300 A | 11/1986 | McElroy |
| 4,700,329 A | 10/1987 | Yamada et al. |
| 5,157,634 A | 10/1992 | Dhong et al. |

(Continued)

FOREIGN PATENT DOCUMENTS

| | | |
|---|---|---|
| JP | 63-282993 | 11/1988 |
| JP | 63-282994 | 11/1988 |

(Continued)

OTHER PUBLICATIONS

Response submitted Nov. 23, 2011 in reply to European Extended Search Report mailed Apr. 29, 2011 regarding EP Application No. 10185622.7.

(Continued)

*Primary Examiner* — Andrew Q Tran
(74) *Attorney, Agent, or Firm* — Dorsey & Whitney LLP

(57) ABSTRACT

Voltage coupling/decoupling devices are provided within DRAM devices for improving the bias sensing of sense amplifiers and thus the refresh performance. The voltage coupling/decoupling devices couple or decouple bias voltage from corresponding digit lines coupled to the sense amplifiers. By coupling and decoupling voltage from the digit lines, the time interval between refresh operations can be increased.

12 Claims, 7 Drawing Sheets

(56) References Cited

U.S. PATENT DOCUMENTS

| | | |
|---|---|---|
| 5,291,437 A | 3/1994 | Rountree |
| 5,424,977 A | 6/1995 | Rountree |
| 5,646,881 A | 7/1997 | Park et al. |
| 5,701,268 A | 12/1997 | Lee et al. |
| 5,995,421 A | 11/1999 | McKenny |
| 6,097,650 A | 8/2000 | Brede et al. |
| 6,157,578 A | 12/2000 | Brady |
| 6,157,581 A | 12/2000 | Higashi |
| 6,169,701 B1 | 1/2001 | Eto et al. |
| 6,212,110 B1 | 4/2001 | Sakamoto et al. |
| 6,538,942 B2 | 3/2003 | Ferrant |
| 6,549,449 B2 | 4/2003 | Takashima |
| 6,603,685 B2 | 8/2003 | Hidaka et al. |
| 6,614,702 B2 | 9/2003 | Lee |
| 6,757,202 B2 * | 6/2004 | McElroy et al. ......... 365/189.09 |
| 6,862,208 B2 | 3/2005 | Paimer et al. |
| 7,072,235 B2 * | 7/2006 | Casper et al. .................. 365/204 |
| 7,567,477 B2 | 7/2009 | McElroy et al. |
| 7,903,488 B2 * | 3/2011 | McElroy et al. ............. 365/204 |
| 2001/0053099 A1 | 12/2001 | Hidaka et al. |
| 2002/0009008 A1 | 1/2002 | Ferrant |
| 2002/0080664 A1 | 6/2002 | Takashima |

FOREIGN PATENT DOCUMENTS

| | | |
|---|---|---|
| JP | 01-144292 | 6/1989 |
| JP | 1144292 A | 6/1989 |
| JP | 3296989 A | 12/1991 |
| JP | 5210975 A | 8/1993 |
| JP | 05-274878 | 10/1993 |
| JP | 5274878 A | 10/1993 |
| JP | 08-339681 | 12/1996 |
| JP | 09-171687 | 6/1997 |
| JP | 10241357 A | 9/1998 |
| JP | 2000187985 A | 7/2000 |

OTHER PUBLICATIONS

Response submitted Jul. 7, 2011 in reply to European Office Action mailed Mar. 11, 2011 regarding EP Application No. 03791803.4.
Supplemental response submitted Nov. 23, 2011 in reply to European Office Action mailed Mar. 11, 2011 regarding EP Application No. 03791803.4.
"Notice of Rejection Grounds" dated Feb. 7, 2012 for Japanese Patent Application No. 2009-186921.
European Extended Search Report mailed Apr. 29, 2011 regarding EP Application No. 10185622.7.
European Office Action mailed Mar. 11, 2011 regarding EP Application No. 03791803.4.
Office Action dated Sep. 6, 2011 for Japanese Patent Application No. 2004-531500.
International Search Report dated Dec. 22, 2003 for PCT/US03/026736.
Written Opinion dated Oct. 26, 2004 for PCT/US03/026736.
JP Interrogation dated Apr. 3, 2012 for JP Appl. No. 2004-531500.
EP Examination dated Sep. 6, 2013 for Appl. No. 03791803.4.
EP First Examination Report for Appl. No. 10185622.7 dated Sep. 11, 2013.

* cited by examiner

BIAS SENSING IN DRAM SENSE AMPLIFIERS THROUGH VOLTAGE-COUPLING/DECOUPLING DEVICE

CROSS-REFERENCE TO RELATED APPLICATIONS

This is a divisional of U.S. patent application Ser. No. 12/498,541, filed Jul. 7, 2009 (now U.S. Pat. No. 7,903,488), which is a continuation of U.S. patent application Ser. No. 11/452,783, filed Jun. 13, 2006 (now U.S. Pat. No. 7,564, 477), which is a divisional of U.S. patent application Ser. No. 10/874,995, filed Jun. 23, 2004 (now U.S. Pat. No. 7,072, 235), which is a continuation of U.S. patent application Ser. No. 10/233,871, filed Aug. 29, 2002 (now U.S. Pat. No. 6,757,202). Each of these prior applications is hereby incorporated by reference herein in its entirety.

BACKGROUND OF THE INVENTION

This invention relates to bias sensing in DRAM (dynamic random access memory) sense amplifiers. More particularly, this invention relates to improving the refresh performance of DRAM devices.

As a result of charge leakage from DRAM memory cells, sense amplifier devices sense (or sample) and restore electrical charge within each of the memory cells of a given DRAM device. In order to sense and restore the electrical charge of a memory cell that is connected to a particular digit line, a sense amplifier compares the bias voltage on a "reference" digit line with the bias voltage on the digit line connected to the memory cell that is accessed (i.e., read).

If a logic "1" is stored in the accessed memory cell capacitor, upon accessing the memory cell, stored electrical charge from the capacitor is shared with the digit line. This slightly raises the voltage on the memory cell digit line relative to the reference digit line bias voltage. The sense amplifier detects this voltage change and applies a suitable voltage (e.g., Vcc) to the memory cell digit line such that the memory cell is recharged and restored to a full level of electrical charge.

If a logic "0" is stored in the memory cell capacitor, upon accessing the memory cell, the absence of stored electrical charge in the capacitor causes some electrical charge present on the biased digit line to be shared with the memory cell. This slightly reduces the voltage on the memory cell digit line relative to the biased reference digit line. The sense amplifier detects this voltage change and applies a ground (GND) signal to the memory cell digit line so that the accessed memory cell is fully discharged (i.e., logic "0").

The refresh time or interval between sensing (i.e., reading) and restoring the electrical charge within memory cells is limited to the bias voltage level applied to the reference digit lines. For example, a DRAM memory cell holding an electrical charge representative of a logic "1," is sensed after a finite time interval (refresh time). The sense amplifier then determines that a logic "1" is stored in the memory cell and restores its electrical charge to full value. However, if this refresh duration is too long, the electrical charge stored within this memory cell will degrade too much. When this occurs, the sense amplifier erroneously determines that a logic "0" is stored in the memory cell. Thus, it does not restore the memory cell electrical charge to its full value (i.e., logic "1").

Therefore, for a memory cell storing a logic "1," the refresh time must occur before the voltage on the sensed memory cell digit line drops below the reference digit line bias voltage. Otherwise, the DRAM device erroneously detects a logic "0."

To avoid this, the interval between refresh times must be reduced. However, by reducing the interval between refresh times, the power dissipation within the DRAM device undesirably increases. This becomes progressively problematic as DRAM memory arrays increase in memory capacity as their physical dimensions decrease. By reducing the reference digit line bias voltage, the time interval between the refresh operation (refresh time) increases as a result of providing an increased margin for electrical charge degradation in the memory cell.

It is known that by including dummy memory cells on the digit lines of DRAM memory devices, the bias voltage for any particular reference digit line can be reduced to improve the refresh performance. By reducing this bias voltage (threshold level), the probability of logic "1" detection increases (increasing reliability), and therefore, the required time between refresh operations increases.

However, the inclusion of dummy cells inefficiently uses fabrication area, which is particularly undesirable in light of the trend towards smaller DRAM array devices with increased memory capacity.

In view of the foregoing, it would be desirable to provide improved refresh performance in DRAM memory devices by varying the threshold or bias voltage used in the sensing operation.

SUMMARY OF THE INVENTION

It is an object of this invention to provide improved refresh performance in DRAM memory devices by varying the threshold or bias voltage used in the sensing operation.

In accordance with the invention, a DRAM device is provided that has a plurality of digit lines and a plurality of sense amplifiers, where each sense amplifier is coupled to an adjacent pair of digit lines. Each adjacent pair of digit lines includes a first digit line and a second digit line. The DRAM device also includes a first voltage coupling/decoupling device having an output coupled to the first digit line and a second coupling/decoupling device having an output coupled to the second digit line. The first voltage coupling device capacitively couples a voltage onto the first digit line and the second voltage coupling device capacitively decouples a second voltage from the second digit line, wherein the first digit line is an "active" digit line and the second digit line is a "reference" digit line.

This embodiment preferably operates as follows in accordance with the invention: an electrical bias voltage is applied to the first and second digit lines. Electrical-charge within the memory cell is accessed such that electrical-charge sharing occurs between the memory cell and the first digit line, generating a first digit line bias voltage. After the memory cell is accessed, voltage is capacitively decoupled from the second digit line, causing a reduction in bias voltage. The DRAM sense amplifier is then fired in order to restore the electrical charge in the memory cell to its designated charge value (logic "1" or logic "0").

A second embodiment of a DRAM device in accordance with the invention has first and second digit lines, first and second transistors, sense amplifiers, and first and second voltage coupling/decoupling devices. The first and second digit lines have a line connection. The first and second transistors each have a first and second terminal. The second terminal of the first transistor couples to the line connection of the first digit line, and the second terminal of the second transistor couples to the line connection of the second digit line.

Each sense amplifier has a first and second sensing connection, wherein the first sensing connection couples to the first terminal of the first transistor, and the second sensing connection couples to the first terminal of the second transistor. Each of the first and second voltage coupling/decoupling devices has an output, wherein the first coupling/decoupling device output couples to the first sensing connection and to the first terminal of the first transistor, and the second coupling/decoupling device output couples to the second sensing connection and to the first terminal of the second transistor.

This second embodiment preferably operates as follows in accordance with the invention: a voltage is applied to the first and second digit lines. Electrical-charge within the memory cell is accessed such that electrical charge sharing occurs between the memory cell and the first digit line, generating a first digit line bias voltage. After the memory cell is accessed, the first isolation transistor is switched ON so that the first sensing connection couples to the first digit line, and the second isolation transistor is switched ON so that the second sensing connection couples to the second digit line. The first and second isolation transistors are then switched OFF so that the first and second sensing connections are electrically isolated from the first and second digit lines. Following the isolation of the sense amplifier connections from the digit lines, a second voltage is capacitively decoupled from the second sense amplifier connection, thus reducing its bias voltage. The DRAM sense amplifier is then fired in order to restore the electrical charge in the memory cell to its designated charge value (logic "1" or logic "0").

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

The invention provides DRAM sense amplifier devices with improved bias sensing. These sense amplifiers include additional devices for either capacitively decoupling voltages from "reference" digit lines, capacitively coupling voltages onto "active" digit lines, or both. Note that a digit line attached to an accessed memory cell is designated as being the "active" digit line. A digit line adjacent to the "active" digit line and sharing a common sense amplifier with it is designated as the "reference" digit line. Therefore, "active" and "reference" digit lines dynamically change based on which of the two digit lines is coupled to an accessed memory cell. By decoupling voltage from a reference digit line, or by coupling voltage onto an active digit line, or by both coupling and decoupling voltage onto and from these digit lines, bias (threshold) voltage sensing by the sense amplifiers is improved.

Figure 1:
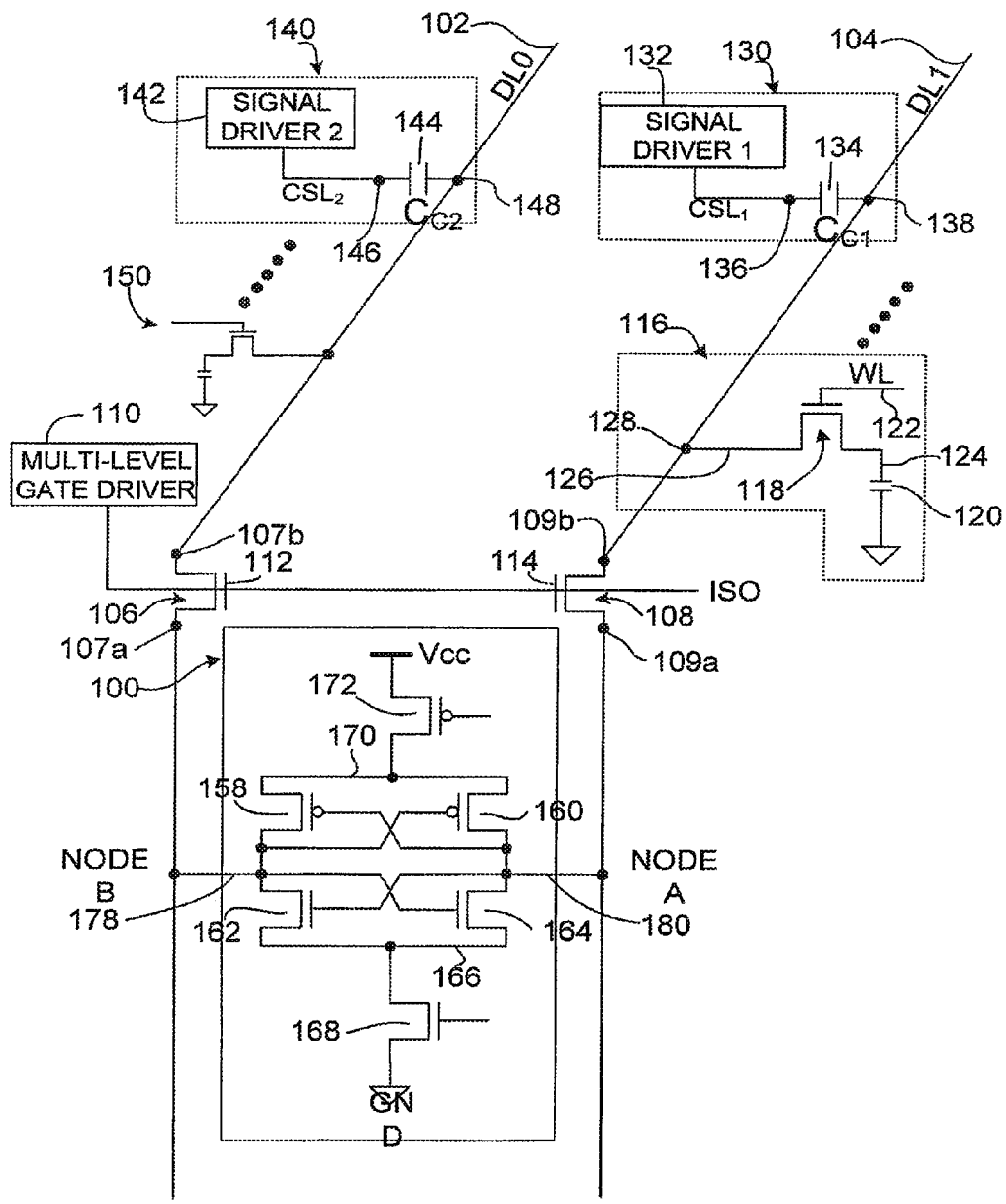
FIG. 1 is a circuit diagram of a first embodiment of a DRAM memory circuit according to the invention.

FIG. 1 shows a DRAM sense amplifier circuit 100 within a DRAM array, wherein sense amplifier 100 is connected to a pair of adjacent digit lines 102, 104 through a pair of isolation transistors 106, 108. Sense amplifier 100 is coupled to digit line 104 through isolation transistor 108 and coupled to digit line 102 through isolation transistor 106. Isolation transistor 108 has terminals 109a, 109b, wherein terminal 109b connects to digit line 104, and terminal 109a couples to sense amplifier 100. Isolation transistor 106 has terminals 107a, 107b, wherein terminal 107b connects to second digit line 102, and terminal 107a couples to sense amplifier 100.

Both isolation transistors 106 and 108 are controlled by a multi-level gate driver 110 that simultaneously applies suitable drive voltages to respective terminals 112, 114 of isolation transistors 106 and 108. The drive voltages switch the isolation transistors 106, 108 ON or OFF to control the electrical isolation between digit lines 102, 104 and sense amplifier 100. A plurality of memory cells such as memory cells 116 and 150 are connected respectively to digit lines 104 and 102. For clarity, only memory cells 116 and 150 are shown in FIG. 1.

Memory cell 116 includes a transistor 118 and a capacitor 120, wherein the gate of transistor 118 connects to a wordline 122 (WL) within the DRAM array. Terminal 124 of transistor 118 connects to one end of capacitor 120, wherein the other end of capacitor 120 is grounded. The other terminal 126 of transistor 118 connects to digit line 104, at node 128.

A first voltage coupling/decoupling device 130 is also connected to digit line 104. Voltage coupling device 130 includes a coupling/decoupling capacitor 134 and a signal driver device 132. Capacitor 134 connects to the output of signal driver 132 at node 136 and connects to digit line 104 at node 138. Node 138 is the output of voltage coupling/decoupling device 130.

A second voltage coupling/decoupling device 140 is connected to digit line 102. Voltage coupling device 140 includes capacitor 144 and a second signal driver device 142. Capacitor 144 connects to the output of signal driver 142 at node 146 and connects to digit line 102 at node 148. Node 148 is the output of voltage coupling/decoupling device 140.

Sense amplifier device 100 includes an N-sense and a P-sense amplifier. The P-sense amplifier includes a cross-coupled PMOS transistor pair having a first PMOS transistor 158 and a second PMOS transistor 160. The N-sense amplifier includes a cross coupled NMOS transistor pair having a first NMOS transistor 162 and a second NMOS transistor 164. The first PMOS transistor 158 and the first NMOS transistor 162 share a common connection 178 that couples to digit line 102 through node B and isolation transistor 106. Second PMOS transistor 160 and second NMOS transistor 164 share a common sensing connection 180 that couples to digit line 104 through node A and isolation transistor 108. A common node connection 166 between NMOS transistor pair 162, 164 is normally biased at Vcc/2 (half the supply rail). The N-sense amplifier is "fired" or activated by connecting common node connection 166 to ground via turned ON transistor 168. This effectively pulls the common node connection 166 from Vcc/2 to ground (0V).

Similarly, a common node connection 170 between PMOS transistor pair 158, 160 is normally biased at about 0V (ground). The P-sense amplifier is "fired" or activated by connecting common node connection 170 to Vcc (supply rail)

via turned ON transistor 172. This effectively pulls the common node connection from 0V to Vcc.

During the sensing and restoring operation, both the N-sense and P-sense amplifiers are fired sequentially, with the N-sense amplifier "fired" first, followed by the P-sense amplifier.

Note that for illustration purposes only, digit line 102 is designated the "reference" digit line 102 and digit line 104 is designated the "active" digit line. Voltage coupling/decoupling device 140 decouples a percentage (or fraction) of voltage from the "reference" digit line 102 to reduce the bias voltage on this line. Voltage coupling/decoupling device 130 may (optionally) couple a percentage (or fraction) of voltage onto the "active" digit line 104 to increase the bias voltage on this line.

Thus, an increase in the voltage difference between "reference" digit line 102 and "active" digit line 104 can be accomplished by either decoupling voltage from "reference" digit line 102, coupling voltage to "active" digit line 104, or both decoupling voltage from "reference" digit line 102 and coupling voltage onto "active" digit line 104. The voltage coupling or decoupling function of voltage coupling/decoupling devices 130, 140 depends on whether their corresponding digit lines are designated as being an "active" digit line or a "reference" digit line.

Figure 2:
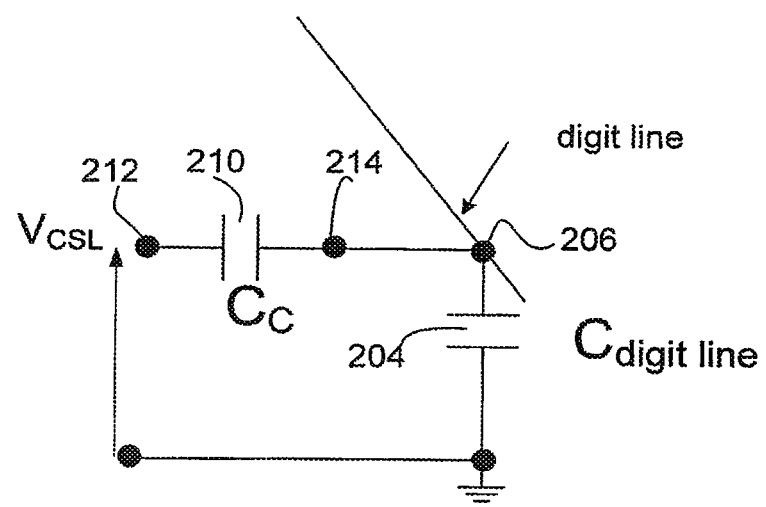
FIG. 2 is an electrical representation of a first embodiment of a coupling network according to the invention.

FIG. 2 shows an electrical representation of the voltage coupling/decoupling device of FIG. 1 (device 130 or 140). The digit line capacitance 204 is denoted by $C_{digitline}$ and is electrically represented as a capacitor having a first connection to digit line 206 and a second connection to ground. The digit line capacitance is not a fabricated component such as coupling/decoupling capacitor 210. It is an existing parasitic effect and is therefore not included in the circuit diagram of FIG. 1.

Figure 5:
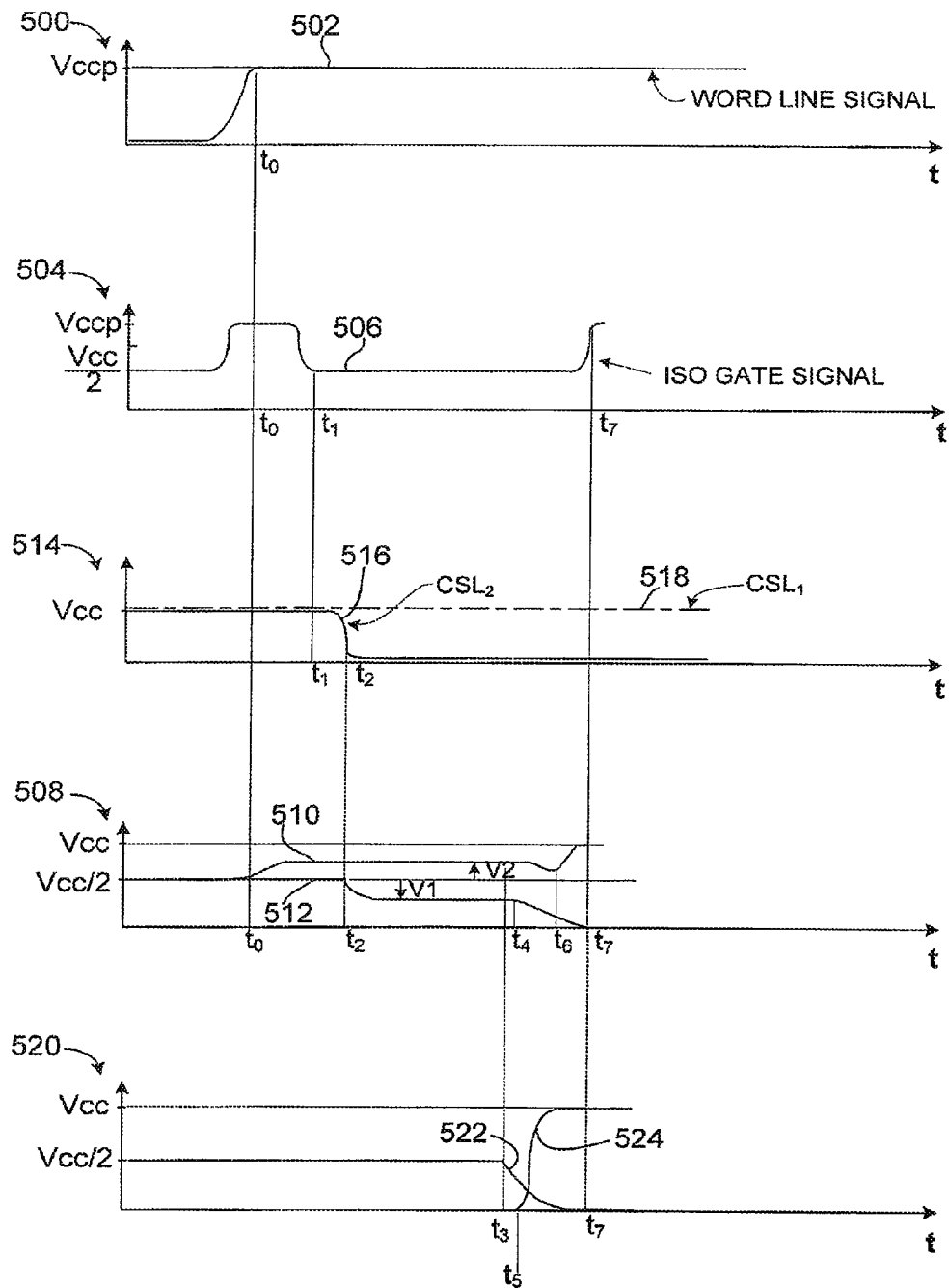
FIG. 5 is a timing diagram illustrating various signal voltages corresponding to the refresh operation of a DRAM memory sense amplifier according to the invention.
Figure 6:
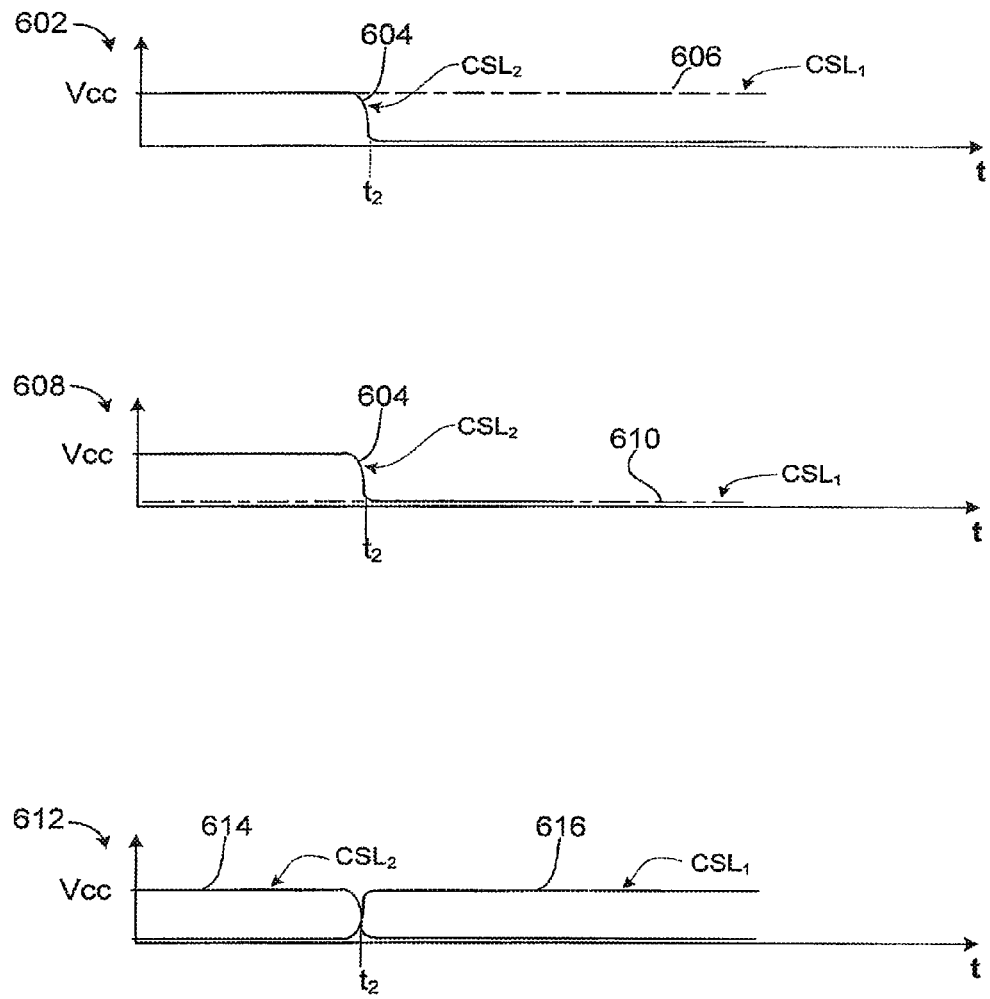
FIG. 6 is a timing diagram illustrating applied signal voltages for coupling and decoupling voltages from digit lines during the sensing of a memory cell according to the invention.

Coupling/decoupling capacitor 210 has first and second connection terminals 212, 214, wherein first connection terminal 212 receives a coupling/decoupling drive voltage signal ($V_{CSL}$) from a voltage driver device or signal source. Second connection terminal 214 connects to digit line 206 and thus to the first connection of the digit line capacitance 204. A capacitive network is therefore formed between coupling/decoupling capacitor 210 and digit line capacitance 204. By applying a suitable coupling/decoupling drive voltage signal ($V_{CSL}$) to connection terminal 212, voltage can be decoupled from, or coupled to, digit line 206. This is also shown in equation (1) below:

$$\Delta V_{NODE} = \frac{C_C}{C_C + C_{digitline}} \times \Delta V_{CSL} \qquad (1)$$

where $\Delta V_{NODE}$ is the change in voltage on digit line 206, $C_C$ is the capacitance of coupling/decoupling capacitor 210, $C_{digitline}$ is the capacitance 204 of digit line 206, and $\Delta V_{CSL}$ is the voltage switching magnitude generated by the coupling/decoupling drive voltage signal ($V_{CSL}$). FIGS. 5 and 6 illustrate the coupling and decoupling process in more detail.

Comparing the electrical representation of FIG. 2 with coupling/decoupling devices 130, 140 in FIG. 1, coupling/decoupling capacitor 210 is equivalent to coupling/decoupling capacitors 134 and 144. Also, $V_{CSL}$ is generated by each signal driver device 132, 142, wherein signal driver device 132 generates a first drive voltage signal ($V_{CSL1}$) and signal driver device 142 generates a second drive voltage signal ($V_{CSL2}$). The voltage switching magnitude $\Delta V_{CSL}$ generated by both drive voltage signals ($V_{CSL}$) provides the necessary signaling for coupling or decoupling voltage onto or off of corresponding digit lines 102 and 104. The capacitance ($C_{digitline}$) 204 of digit line 206 is equivalent to the parasitic capacitance of digit lines 102 and 104. The signal driver devices (132 or 142) apply the coupling/decoupling drive voltage signals ($V_{CSL}$) onto signal lines 136, 146, where the drive voltage signals ($V_{CSL}$) are received by coupling/decoupling capacitors 134, 144, respectively. The switching transition direction (low-to-high or high-to-low) of the voltage switching magnitude $\Delta V_{CSL}$ determines whether voltage is coupled onto or off of the digit line. Thus, the change in voltage on the digit line ($\Delta V_{NODE}$) depends on whether a voltage is coupled to the digit line (increasing its bias voltage), or whether a voltage is decoupled from the digit line (reducing its bias voltage).

Note, from Equation (1) that by increasing both the capacitance value of coupling/decoupling capacitor 210 and the voltage switching magnitude $\Delta V_{CSL}$, a higher percentage (or fraction) of coupling or decoupling can be achieved. For example, to decouple 10% of the bias voltage from the digit line, the coupling/decoupling capacitance should be approximately one tenth (1/10), or ten percent of the digit line capacitance. However, if the digit line capacitance is relatively large, the coupling/decoupling capacitor must be proportionally increased, which results in the fabrication of larger capacitor devices at the expense of reducing DRAM memory capacity per device size.

The voltage switching magnitude ($\Delta V_{SCL}$) generated by the signal driver device (132 or 142) is normally between ground and the supply rail (Vcc) in order to maximize the coupling/decoupling fraction. Note that the voltage switching magnitude ($\Delta V_{SCL}$) can be varied (increased or decreased) between a first and second voltage by the signal driver device (132 or 142) in order to vary the coupling/decoupling fraction. Both the first and second voltage generated by the signal driver device (132 or 142) are controllably variable. Also note that more than one coupling/decoupling capacitor may be connected between any given digit line and signal driver device.

In describing the sensing operation of sense amplifier 100, memory cell 116 is considered to hold electrical-charge corresponding to a stored logic "1." As previously indicated, during accessing (i.e., reading), sensing, and restoring the charge within memory cell 116, digit line 104 is considered the "active" digit line, and adjacent digit line 102 is considered the "reference" digit line. Also, both digit lines are pre-biased at Vcc/2 (half the supply rail) prior to firing the N-sense and P-sense amplifiers.

In order to access electrical-charge stored within memory cell 116, suitable voltage is applied to the gate of transistor 118 by means of world line (WL) 122. Once the gate voltage is applied and transistor 118 is fully turned ON, a low impedance electrical connection is established between terminals 124 and 126 of the transistor 118. This effectively connects one side of capacitor 120 directly to digit line 104 such that electrical-charge sharing occurs between capacitor 120 and digit line 104. Due to the electrical-charge from capacitor 120 discharging onto "active" digitline 104, there will be a slight increase in "active" digit line bias voltage compared with the bias voltage on adjacent reference digit line 102. Therefore, a detectable voltage difference ($\Delta V$) occurs between digit lines 104 and 102.

Once memory cell 116 is accessed, gate driver 110 applies a gate voltage to gate terminal 114 and to gate terminal 112 of isolation transistors 108, 106, respectively. This causes both isolation transistors 106, 108 to fully turn ON. With isolation transistor 106 in the ON state, an electrical connection is established between node B and "reference" digit line 102. Sensing connection 178 of sense amplifier 100 connects to node B and therefore to "reference" digit line 102. Similarly, with transistor 108 in the ON state, an electrical connection is established between node A and "active" digit line 104. Sensing connection 180 of sense amplifier 100 connects to node A and therefore to "active" digit line 104. Thus, the voltage on "active" digit line 104 is received by the sense amplifier's sensing connection 180, and the voltage on "reference" digit line 102 is received by the sense amplifier's sensing connection 178. Once the isolation transistors are in the OFF state, sense amplifier connections 178 and 180 are isolated from respective digit lines 102, 104. However, the voltages on digit lines 102 and 104 remain stored on nodes A and B and sensing connections 178, 180.

The voltage difference between "active" digit line 104 and "reference" digit line 102 is relatively small. By increasing this voltage difference, both the sensing and the refresh performance of the DRAM device can be improved. In terms of the sensing operation, for example, there will be less probability of sense amplifier 100 erroneously allocating or not allocating the appropriate electrical charge to an accessed memory cell. Also, as the voltage difference between "active" digit line 104 and "reference" digit line 102 increases, the time interval between necessary refresh operations advantageously increases. This is due to the bias voltage on "reference" digit line 102 having a lower voltage threshold, which in turn allows the electrical-charge in accessed memory cell 116 to further deteriorate without becoming undetectable. This means that once the deteriorated electrical-charge in memory cell 116 is accessed, the bias voltage on "active" digit line 104 is still higher than reference digit line 102. However, in accordance with the correct operation of the invention, if no charge is present in accessed memory cell 116 (i.e., logic "0" stored), the bias voltage on "active" digit line 104 must have a lower bias voltage value than that of "reference" digit line 104.

The aforementioned increase in the voltage difference between "active" digit line 104 and "reference" digit line 102 is achieved by activating voltage coupling/decoupling device 140 such that a fraction or percentage of the existing reference digit line bias voltage (i.e., Vcc/2) is decoupled from reference digit line 102. Thus, the decrease in bias voltage on "reference" digit line 102, and the increase in bias voltage on "active" digit line 104 because of accessing memory cell 116, achieves this voltage difference increase. Because isolation transistors 106, 108 are still ON, the increase in bias voltage on "active" digit line 104 and the decrease in bias voltage on "reference" digit line 102 appear at nodes A and B, respectively.

The sense amplifier's sensing connections 180, 178 receive the respective bias voltages present on the "active" and "reference" digit lines from nodes A and B, respectively. Prior to "firing" the P- and N-sense amplifiers, isolation transistors 106, 108 are turned OFF such that the P- and N-sense amplifiers are isolated from the parasitic capacitance of digit lines 102 and 104. Therefore, gate driver 110 removes the previously applied voltage from both isolation transistor gates 112, 114. This turns both transistors 106, 108 OFF, resulting in the electrical isolation of nodes A and B and sensing connections 180, 179 from digit lines 104, 102.

In the case of memory cell 116 (having a stored logic "1"), the increase in the active digit line 104 bias voltage (also present at node A) relative to the reference digit line 102 bias voltage is detected when the N-sense amplifier is "fired." Once "fired," transistor 162 turns ON, connecting "reference" digit line 102 to ground (0V). The higher bias voltage on "active" digit line 104 causes transistor 162 to start conducting prior to the conduction of transistor 164. Transistor 164 is thus held in the OFF state when transistor 162 turns ON.

Once reference digit line 102 is grounded, the P-sense amplifier is "fired." Upon "firing" the P-sense amplifier, transistor 160 turns ON and connects "active" digit line 104 to the supply voltage (Vcc) via connection 180 and node A. It will be appreciated that isolation transistor 108 must be turned ON again once the charge voltage (Vcc) is applied to node A following the "firing" of the P-sense amplifier. This provides an electrical path between the charge voltage present at node A and "active" digit line 104. If the isolation transistor is OFF, the charge voltage is isolated from the "active" digit line 104.

With isolation transistor 108 turned ON, the charge voltage (Vcc) is supplied to "active" digit line 104. Also, with memory cell transistor 118 in the ON state (WL active), the charge voltage on "active" digit line 104 charges memory cell capacitor 120 to its full capacity. Memory cell transistor 118 is then turned OFF by removing the gate voltage from word line 122. The charge on memory cell capacitor 120 is now restored and isolated from digit line 104.

If, for example, memory cell 116 stores relatively no electrical-charge (i.e., logic "0"), once memory cell 116 is accessed, the charge sharing will conversely cause the "active" digit line 104 bias voltage to decrease relative to the "reference" digit line 102 bias voltage. Once isolation transistors 106, 108 are turned ON, both the "active" digit line 104 bias voltage and the "reference" digit line 102 bias voltage are received by sensing connections 180, 178, respectively. Isolation transistors 106, 108 are then turned OFF and the sense amplifier is "fired." The decrease in the "active" digit line 104 bias voltage relative to the "reference" digit line 102 bias voltage is detected by sense amplifier 100. Therefore, following the "firing" of sense amplifier 100, a ground reference signal is applied (i.e., 0V) to the "active" digit line 104 via node A and isolation transistor 108 (which is ON). To restore memory cell 116 (to logic "0"), the cell must be accessed, thus, transistor 118 is fully ON.

Figure 3:
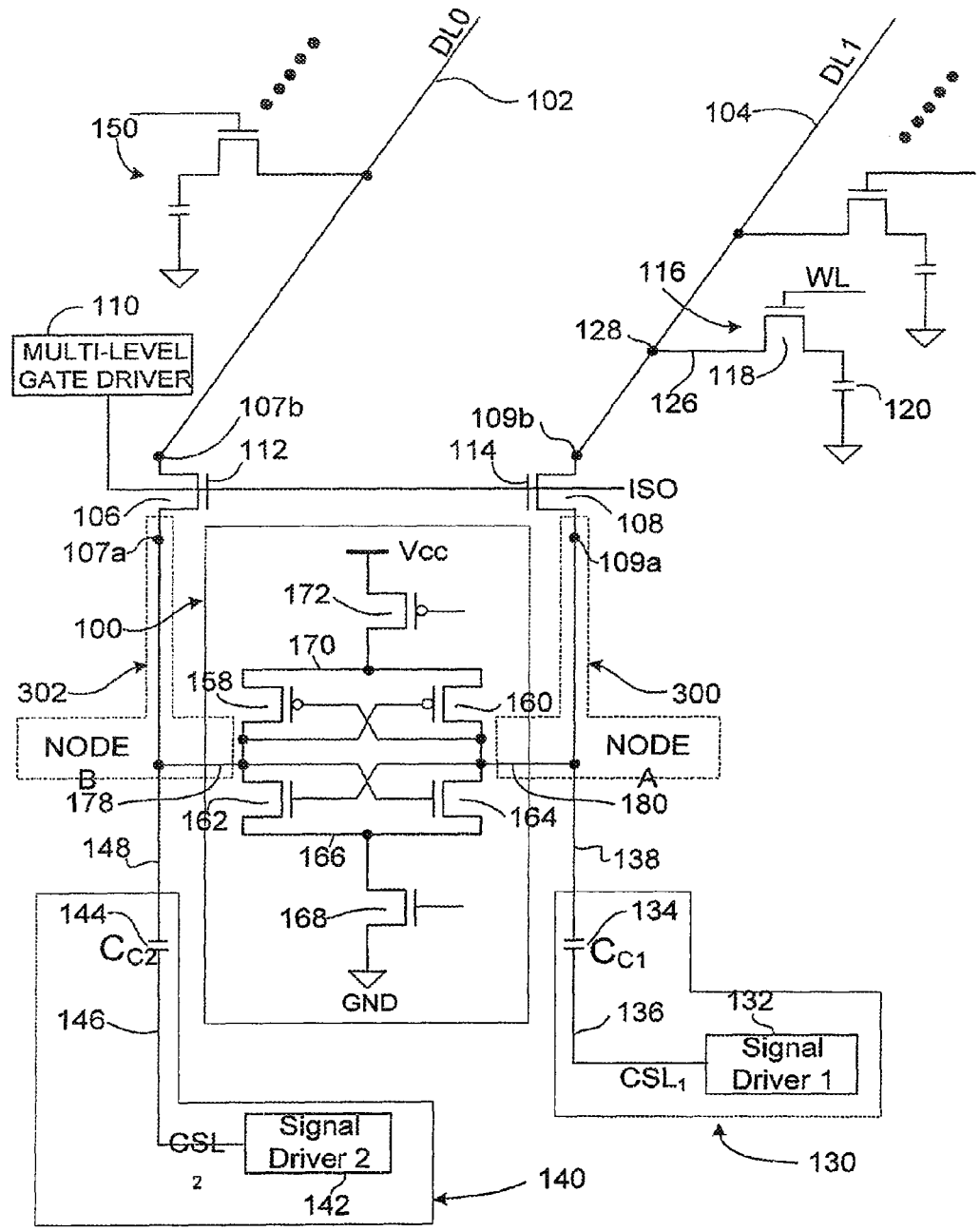
FIG. 3 is a circuit diagram of a second embodiment of a DRAM memory circuit according to the invention.

FIG. 3 illustrates a second embodiment of the invention. One difference between the embodiments of FIGS. 1 and 3 is that in FIG. 3 coupling/decoupling capacitors 134, 144 are connected to nodes A and B rather than directly to digit lines 104 and 102 as in FIG. 1.

As illustrated in FIG. 3, sensing connection 180 of sense amplifier 100 connects to terminal 109a of isolation transistor 108 via node A. This connection between sense amplifier 100 and isolation transistor 108 is referred to as a first "gut-node" 300. Terminal 136 of coupling/decoupling capacitor 134 connects to signal driver 132 (as in FIG. 1). Terminal 138 of coupling/decoupling capacitor 134 connects to "gut-node" 300 at node A.

Similarly, sensing connection 178 of sense amplifier 100 connects to terminal 107b of isolation transistor 106 via node B. This connection between sense amplifier 100 and isolation transistor 106 is referred to as a second "gut-node" 302. Terminal 146 of coupling/decoupling capacitor 144 connects to signal driver 142 (as in FIG. 1). Terminal 148 of coupling/decoupling capacitor 144 connects to "gut-node" 302 at node B.

Figure 4:
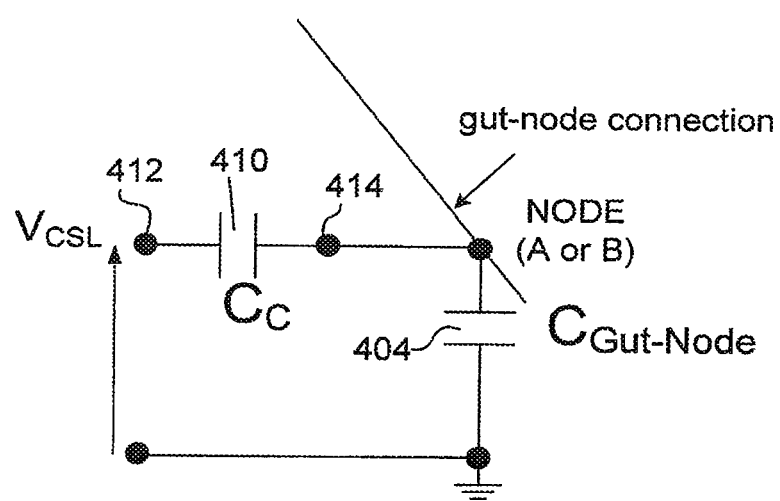
FIG. 4 is an electrical representation of a second embodiment of a coupling network according to the invention.

FIG. 4 shows an electrical representation of the coupling/decoupling device configuration used in FIG. 3. As described in the previous paragraph, coupling/decoupling capacitors 134 and 144 are respectively connected to "gut-nodes" 300 and 302 as opposed to directly connecting them to the digit lines. "Gut-node" capacitance 404 is electrically represented as a capacitor having a first connection to the "gut-node," and a second connection to ground. The "gut-node" capacitance is not a fabricated component, such as coupling/decoupling capacitor 410. It is an existing parasitic effect and is therefore not included in the circuit diagram of FIG. 3.

Coupling/decoupling capacitor 410 has a first and second connection terminal, wherein the first connection terminal 412 receives a coupling/decoupling drive voltage signal ($V_{CSL}$) from a voltage driver device or signal source. Terminal 414 of coupling/decoupling capacitor 410 connects to the "gut-node" and thus to the first connection of "gut-node" capacitor 404. Therefore, a capacitive network is formed between coupling/decoupling capacitor 410 and "gut-node" capacitor 404, wherein by applying a suitable coupling/decoupling drive voltage signal ($V_{CSL}$) to terminal 412 of coupling/decoupling capacitor 410, voltage can be decoupled from, or coupled to, the "gut-node." This is also shown in equation (2) below:

$$\Delta V_{NODE} = \frac{C_C}{C_C + C_{gut-node}} \times \Delta V_{CSL} \qquad (2)$$

where $\Delta V_{NODE}$ is the change in voltage on the "gut-node," $C_c$ is the capacitance of coupling/decoupling capacitor 410, $C_{gut-node}$ is the capacitance 404 of the "gut-node," and $\Delta V_{CSL}$ is the voltage switching magnitude generated by the coupling/decoupling drive voltage signal ($V_{CSL}$).

Comparing the electrical representation of FIG. 4 with coupling/decoupling devices 130, 140 in FIG. 3, coupling/decoupling capacitor 410 is equivalent to coupling/decoupling capacitors 134 and 144. Also, $V_{CSL}$ is generated by the first or second signal driver devices 132, 142, wherein signal driver device 132 generates a first drive voltage signal ($V_{CSL1}$) and signal driver device 142 generates a second drive voltage signal ($V_{CSL2}$). The voltage switching magnitude $\Delta V_{CSL}$ generated by both drive voltage signals $V_{CSL}$ provides the necessary signaling for coupling or decoupling voltage onto or off of corresponding digit lines 102 and 104. The "gut-node" capacitance ($C_{gut-node}$) 404 is a parasitic element. The signal driver devices (132 or 142) generate the coupling/decoupling drive voltage signals ($V_{CSL}$) that are received by coupling/decoupling capacitors 134 and 144. The switching transition direction (low-to-high or high-to-low) of the voltage switching magnitude $\Delta V_{CSL}$ determines whether voltage is coupled to or decoupled from the digit line.

Equation (2) shows that by increasing the capacitance value of coupling/decoupling capacitor 410 and the voltage level change $\Delta V_{SCL}$, a higher percentage (or fraction) of coupling or decoupling can be achieved. The advantage of connecting coupling/decoupling capacitors 134 and 144 to "gut-nodes" 300 and 302 is that a higher fraction or percentage of voltage coupling/decoupling can be achieved. This is due to the much lower capacitance value of "gut-nodes" 300 and 302. Referring to equation (2), it can be seen that for a given magnitude of voltage decoupling or coupling, the capacitance of coupling/decoupling capacitors 134 and 144 can be substantially less as a result of the relatively low capacitance of "gut-nodes" 300, 302. In the configuration of FIG. 1, where coupling/decoupling capacitors 134 and 144 are connected to respective digit lines 104 and 102, the relatively high capacitance ($C_{digitline}$) of digit lines 102 and 104 required that coupling/decoupling capacitors 134 and 144 also have a proportionally high capacitance as well. Therefore, the "gut-node" capacitance provides voltage coupling with the use of much smaller coupling/decoupling capacitors 134, 144. This advantageously enables the fabrication of physically smaller capacitors within a DRAM memory device. Also, for a given constraint in coupling/decoupling capacitor size, relatively more voltage coupling/decoupling is achievable in comparison to coupling/decoupling voltage directly from the digit line (as in FIG. 1). This results because $C_{gut-node}$ is considerably less (e.g., one tenth) than $C_{digitline}$. Referring to equations (1) and (2), for a constant value of coupling/decoupling capacitance ($C_C$), the smaller $C_{digitline}$ and $C_{gut-node}$, the higher the magnitude of generated voltage coupling or decoupling.

In order for the "gut-node" capacitance to be effective in the coupling and decoupling of voltage from the digit lines being sensed, when sense amplifier 100 is fired, both isolation transistors 106, 108 should be turned either fully OFF or partially OFF. If transistors 106, 108 are fully ON (i.e., in saturation), for each digit line, both the digit line capacitance and the "gut-node" capacitance will be electrically in parallel. Therefore, the total capacitance will be the sum of both the digit line capacitance and the "gut-node" capacitance, wherein the digit line capacitance is considerably higher than the "gut-node" capacitance. Referring to equation (1) or (2), the increase in total capacitance in the denominator will reduce the voltage coupling/decoupling fraction or percentage considerably. Thus, the advantage of exploiting the "gut-node" capacitance will be substantially diminished if the isolation transistors are fully ON. Both isolation transistors 106, 108 should be either OFF or partially OFF.

As previously indicated, the voltage switching magnitude ($\Delta V_{CSL}$) generated by the signal driver device (132 or 142) is normally between ground and the supply rail (Vcc) in order to maximize the coupling/decoupling fraction. Note that the voltage level change value ($\Delta V_{CSL}$) can be varied (increased or decreased) between a first and a second voltage by the signal driver device (132 or 142) in order to vary the coupling/decoupling fraction. Also note that more than one coupling/decoupling capacitor may be connected between any given digit line and signal driver device.

The operation of the embodiment of FIG. 3 will now be described with reference to the timing diagrams illustrated in FIG. 5. As shown in timing diagram 500, in order to access memory cell 116, at a time $t_0$, a wordline voltage signal 502 (Vccp) is applied to gate 122 of transistor 118. The magnitude of this voltage signal ensures that memory cell 116 is fully turned ON during the subsequent sense and restore operations.

As shown in timing diagram 504, at time to, an ISO gate signal 506, is raised from Vcc/2 to Vccp so that the gate voltages of isolation transistors 106 and 108 are raised above their threshold value. This turns isolation transistors 106, 108 ON such that the voltage on "active" digit line 104 and "reference" digit line 102 are received by respective "gut-nodes" 300 and 302, and are therefore received by sensing connections 180 and 178 of sensing amplifier 100.

Timing diagram 508 shows the bias voltages at gut-nodes 300 and 302. As illustrated, prior to time to, both gut-nodes 300, 302 are biased at Vcc/2. At $t_0$, once memory cell 116 (i.e., stored logic "1") and isolation transistor 108 are accessed, electrical-charge sharing occurs between "active" digit line 104 and memory cell 116. This causes a voltage increase (V2) in the "active" digit line bias voltage. As the "active" digit line 104 and gut-node 300 are connected via the turned ON isolation transistor, the first "gut-node" bias voltage 510 is charged to the increased "active" digit line bias voltage (V2 increase). Also following time to, the second "gut-node" bias voltage 512 is the same as the "reference" digit line bias voltage.

Referring to timing diagram 504, at time $t_1$, the gate signal 506 applied to isolation transistors 106 and 108 returns to Vcc/2 (or lower). This causes transistors 106, 108 to partially or completely turn OFF (depending on device threshold). In either case, digit lines 102 and 104 are isolated from respective gut-nodes 302 and 300. However, both the increased "active" digit line bias voltage and the "reference" digit line bias voltage are present (stored) on both "gut-node" 300 and "gut-node 302" respectively. Therefore, these bias voltages are also received at sensing connections 178 and 180 of sensing amplifier 100.

Now that sufficient isolation exists between gut-nodes 302 and 300, and digit lines 102 and 104, at time $t_2$, voltage is decoupled from "reference" digit line 102 by means of coupling/decoupling device 140. Timing diagram 514 shows the coupling/decoupling drive voltage signal ($V_{CSL2}$) 516 generated by signal driver device 142. At time t2, the coupling/decoupling drive voltage signal 516 makes a high-to-low voltage transition from Vcc to ground ($\Delta V_{CSL}$). This voltage switching magnitude ($\Delta V_{CSL}$) applied by signal driver device 142 to the capacitor network ($C_C$ and $C_{gut\text{-}node}$) decouples a desired percentage or fraction of the "reference" digit line bias voltage that is now stored on "gut-node" 302. This is illustrated in timing diagram 508, wherein, the second "gut-node" bias voltage 512 decreases (by V1) at time $t_2$. Thus, the bias voltage on "gut-node" 302 is reduced in favor of increasing the refresh performance.

The coupling/decoupling drive voltage signal ($V_{CSL1}$) 518 is generated by signal driver device 132. As illustrated in the timing diagram, at time t2, drive voltage signal 518 makes no voltage transition ($\Delta V_{CSL}=0$). Referring to equation (2), no voltage coupling or decoupling (i.e., $\Delta V_{NODE}=0$) occurs unless a voltage transition occurs in the coupling/decoupling drive voltage signal ($\Delta V_{SCL}$). Thus, the bias voltage on "gut-node" 300 is unchanged.

As illustrated in timing diagram 520, at time $t_3$, the N-sense amplifier is "fired," wherein the common node bias voltage 522 on common node connection 166 is dropped from Vcc/2 (half the supply voltage) to near ground. This connects gut-node 302 to ground, as illustrated in timing diagram 508 at time $t_4$. At time $t_5$ of timing diagram 520, the P-sense amplifier is "fired," wherein the common node bias voltage 524 on common node connection 170 is raised from ground (0V) to Vcc (supply voltage). This connects gut-node 300 to the supply voltage, as illustrated in timing diagram 508 at time instant $t_6$.

As illustrated in timing diagram 504, at time instant $t_7$, the isolation transistors are turned ON by increasing the voltage of the ISO gate signal 506 from Vcc/2 to Vccp. Consequently, an electrical path between "gut-node" 300 and "active" digit line 104 is established. Therefore, the applied supply voltage on "gut-node" 300 is also received by "active" digit line 104. Because memory cell transistor 118 is still fully ON, memory cell capacitor 120 is fully charged by the supply voltage. Thus, the electrical charge within memory cell 116 is fully restored by the application of a charge voltage (e.g., supply voltage) to "active" digit line 104.

FIG. 6 illustrates different signaling schemes for coupling and decoupling voltage onto or off of digit lines and their respective "gut-nodes" during the sensing operation of the sense amplifiers.

Timing diagram 602 is identical to timing diagram 514 shown in FIG. 5. Timing diagram 602 shows that at time $t_2$, the second coupling/decoupling drive voltage signal 604 ($\Delta V_{CSL2}$) makes a high-to-low voltage transition ($\Delta V_{CSL}$) from Vcc to ground. This provides voltage decoupling from the "reference" digit line bias voltage stored on "gut-node" 302. The first coupling/decoupling drive voltage signal 606 ($V_{CSL1}$) is in the "logic high" state and makes no voltage transition at time $t_2$. Therefore, no voltage change is applied to the "active" digit line bias voltage stored on "gut-node" 300. Timing diagram 608 shows the first coupling/decoupling drive voltage signal 610 ($V_{CSL1}$) in the "logic low" state. Once again, no voltage change is applied to the "active" digit line bias voltage stored on "gut-node" 300. Thus, the "gut-node" bias voltage remains unchanged (i.e., no coupling or decoupling). If the voltage is kept constant, no voltage coupling or decoupling will occur.

As previously described, the refresh performance of a DRAM device can also be improved by both coupling bias voltage onto an active digit line or "gut-node," and decoupling bias voltage from a "reference" digit line or "gut-node." The coupling/decoupling drive signals for achieving this are shown in timing diagram 612. Timing diagram 612 shows that at time $t_2$, second coupling/decoupling drive voltage signal 614 ($V_{CSL2}$) makes a high-to-low voltage transition ($\Delta V_{CSL}$) from Vcc to ground. This provides voltage decoupling from the "reference" digit line bias voltage stored on "gut-node" 302. Also, at time $t_2$, first coupling/decoupling drive signal 616 ($V_{CSL1}$) makes a low-to-high voltage transition ($\Delta V_{CSL}$) from ground to Vcc. This provides voltage coupling onto the "active" digit line bias voltage stored on "gut-node" 300. This couples a percentage or fraction of the low-to-high voltage transition ($\Delta V_{CSL}$) onto the "active" digit line or "gut-node," wherein the fraction or percentage of coupling is determined by the capacitor values in the formed capacitor network.

As determined at time $t_2$, the first coupling/decoupling drive voltage signal 616 ($V_{CSL1}$) makes a low-to-high voltage transition ($\Delta V_{CSL}$) and couples a percentage or fraction of the low-to-high voltage transition ($\Delta V_{CSL}$) onto the "active" digit line or "gut-node." In accordance with the invention, the second coupling/decoupling drive voltage signal 614 ($V_{SCL2}$) may be kept at a constant voltage (i.e., no voltage transition) such that voltage is not decoupled from the "reference" digit line. By increasing the bias voltage on the "active" digit line alone, the refresh performance is also improved.

Note that in the embodiment of FIG. 1, the coupling/decoupling fraction or coupling/decoupling percentage is determined by the capacitance of the coupling/decoupling capacitor (e.g., capacitor 134) and the digit line capacitance (e.g., $C_{digitline}$ of "active" digit line 104). Alternatively, in the embodiment of FIG. 3, the coupling fraction or coupling percentage is determined by the capacitance of the coupling/decoupling capacitor (e.g., capacitor 134) and the corresponding "gut-node" capacitance (e.g., $C_{gut\text{-}node}$ located at 300).

Note again that references made to particular "active" or "reference" digit lines were made for illustrative purposes. In accordance with the invention, coupling/decoupling devices are connected to any pair of digit lines that correspond to a particular sense amplifier.

Figure 7:
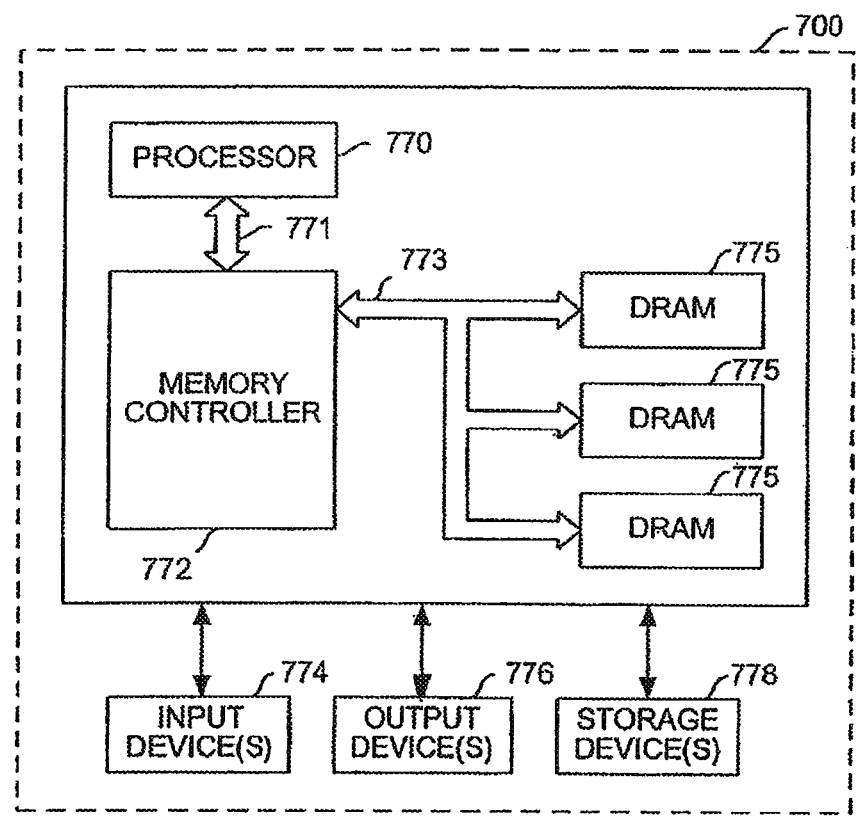
FIG. 7 is a block diagram of a system that incorporates the invention.

FIG. 7 shows a system that incorporates the invention. System 700 includes a plurality of DRAM chips 775, a processor 770, a memory controller 772, input devices 774, output devices 776, and optional storage devices 778. DRAM chips 775 include one of the embodiments illustrated respectively in FIGS. 1 and 3. Data and control signals are transferred between processor 770 and memory controller 772 via bus 771. Similarly, data and control signals are transferred between memory controller 772 and DRAM chips 775 via bus 773. Input devices 774 can include, for example, a keyboard, a mouse, a touch-pad display screen, or any other appropriate device that allows a user to enter information into system 700. Output devices 776 can include, for example, a video display unit, a printer, or any other appropriate device capable of providing output data to a user. Note that input devices 774 and output devices 776 can alternatively be a single input/output device. Storage devices 778 can include, for example, one or more disk or tape drives. Thus it is seen that DRAM sense amplifiers are provided that have improved refresh performances. One skilled in the art will appreciate that the invention can be practiced by other than the described embodiments, which are presented for purposes of illustration and not of limitation, and the invention is limited only by the claims which follow.

We claim:

1. A memory comprising:
   a sense amplifier coupled to first and second sensing nodes;
   a memory cell coupled to the first sensing node via a digit line; and
   a device having an output coupled to the first sensing node, wherein the device is configured to either couple voltage to or decouple voltage from the first sensing node, wherein voltage on the second sensing node remains substantially constant during the coupling or decoupling.

2. The memory of claim 1, wherein the device comprises a voltage coupling device configured to couple voltage to the first sensing node.

3. The memory of claim 1, wherein the device comprises a voltage decoupling device configured to decouple voltage from the first sensing node.

4. The memory of claim 1, wherein the device comprises:
   a voltage driver having an output, the voltage driver configured to generate a voltage; and
   a capacitor coupled to the output of the voltage driver and the first sensing node, the capacitor configured to either couple voltage to or decouple voltage from the first sensing node.

5. The memory of claim 1, further comprising:
   a gate driver configured to couple the first sensing node to the digit line responsive to the device either coupling voltage to or decoupling voltage from the first sensing node.

6. The memory of claim 1, wherein the digit line is a first digit line, the memory further comprising:
   a second digit line; and
   wherein the device is further configured to either couple voltage to or decouple voltage from the first sensing node based, at least in part, on the bias between the first digit line and the second digit line.

7. The memory of claim 1, wherein the sense amplifier is further configured to output a charge value to the digit line.

8. A memory comprising:
   a sense amplifier configured to sense a voltage bias between a first node and a second node;
   a device coupled to the sense amplifier and configured to either couple voltage to or decouple voltage from the first node and wherein the second node is configured to maintain a same voltage responsive, at least in part, to the device either coupling voltage to or decoupling voltage from the first node; and
   wherein the sense amplifier is further configured to output a charge value responsive, at least in part, to the device either coupling voltage to or decoupling voltage from the first node.

9. The memory of claim 8, further comprising:
   a digit line; and
   a memory cell coupled to the digit line and configured to receive the charge value.

10. The memory of claim 9, further comprising:
    a gate driver coupled to the digit line and the sense amplifier, the gate driver configured to couple the digit line to the sense amplifier.

11. The memory of claim 8, wherein the device is a first device, the memory further comprising:
    a second device coupled to the second node and configured to either couple voltage to or decouple voltage from the second node.

12. The memory of claim 8, wherein the device comprises:
    a driver configured to generate a voltage; and
    a capacitor coupled to the driver and configured to either couple voltage to or decouple voltage from the first node.

* * * * *